United States Patent
McMahon et al.

(10) Patent No.: US 7,532,136 B2
(45) Date of Patent: May 12, 2009

(54) ANALOG TO DIGITAL CONVERTER UNIT

(75) Inventors: Scott H R McMahon, Austin, TX (US); Brian C. Kircher, Georgetown, TX (US); Gregory A. North, Austin, TX (US)

(73) Assignee: Luminary Micro, Inc., Austin, TX (US)

( * ) Notice: Subject to any disclaimer, the term of this patent is extended or adjusted under 35 U.S.C. 154(b) by 0 days.

(21) Appl. No.: 12/097,444

(22) PCT Filed: Dec. 21, 2006

(86) PCT No.: PCT/US2006/062461

§ 371 (c)(1),
(2), (4) Date: Jun. 13, 2008

(87) PCT Pub. No.: WO2007/076428

PCT Pub. Date: Jul. 5, 2007

(65) Prior Publication Data

US 2008/0297384 A1 Dec. 4, 2008

Related U.S. Application Data

(60) Provisional application No. 60/870,388, filed on Dec. 16, 2006, provisional application No. 60/597,838, filed on Dec. 21, 2005.

(51) Int. Cl.
*H03M 1/00* (2006.01)
*H03M 1/12* (2006.01)
(52) U.S. Cl. ...................... 341/141; 341/155
(58) Field of Classification Search ............. 341/141, 341/155
See application file for complete search history.

(56) References Cited

U.S. PATENT DOCUMENTS

| 5,166,685 | A | 11/1992 | Campbell, Jr. et al. |
| 5,291,197 | A * | 3/1994 | Abe ........................... 341/141 |
| 5,703,584 | A | 12/1997 | Hill |
| 6,486,809 | B1 | 11/2002 | Figoli |
| 6,507,298 | B1 * | 1/2003 | Barrenscheen et al. ...... 341/141 |

FOREIGN PATENT DOCUMENTS

| CN | 101341657 A | 1/2009 |
| WO | WO2007/076428 | 7/2007 |

* cited by examiner

*Primary Examiner*—Khai M Nguyen
(74) *Attorney, Agent, or Firm*—Matthew J Booth & Associates PLLC; Matthew J Booth

(57) ABSTRACT

The present invention is a programmable Analog to Digital Converter (ADC) unit (200) that includes an analog to digital converter (204), which includes one or more analog inputs (202). The unit (200) additionally includes a control/status register block (216). The unit 200 further includes a FIFO register block (206) with a first, second, third, and fourth FIFO conversion register. Further included is a programmable sequencer (300) that includes a first (208), second (210), third (212), and fourth (214) programmable sample sequencer. And further, the unit (200) includes a first (226), second (228), third (230), and fourth (232) trigger event control multiplexer, where each trigger event control multiplexer corresponds to each programmable sample sequencer.

7 Claims, 2 Drawing Sheets

ANALOG TO DIGITAL CONVERTER UNIT

This application claims the benefits of the earlier filed U.S. Provisional Application Ser. No. 60/597,838, filed Dec. 21, 2005, which is incorporated by reference for all purposes into this specification. Additionally, this application claims the benefits of the earlier filed U.S. Provisional Application Ser. No. 60/870,388, filed Dec. 16, 2006, which is incorporated by reference for all purposes into this specification.

TECHNICAL FIELD

The present invention relates to semiconductor devices. More specifically, the present invention relates to an improved Analog to Digital Converter (ADC) unit.

BACKGROUND ART

The present invention discloses an Analog to Digital Converter (ADC) unit that is incorporated into a microcontroller or some other type of processing unit and that provides the programming user of the device the ability to program a sequence to the Analog to Digital (A to D) conversion process. The present invention is an implementation that has up to four programmable sequences, where the maximal lengths of each sequence programmable sequence is {8, 4, 4, 1}. The present invention also provides that the programmable sequences are prioritized with respect to each other.

In addition, the present invention provides the ADC unit with a user defined event-initiated sampling in addition to interrupt driven events as is typical in other microcontrollers. In a manner similar to interrupt driven events, the present invention provides that system events may initiate or activate one of the programmable sequences for an A to D conversion.

BEST MODE FOR CARRYING OUT THE INVENTION

The present invention discloses a programmable Analog to Digital Converter (ADC) unit that includes the following components. An analog to digital converter that couples to one or more analog inputs. Additionally, a control/status register block that controls the operation of the unit and couples to the analog to digital converter. A FIFO register block with a first, second, third, and fourth FIFO conversion register that couples to the analog to digital converter. Further, a programmable sequencer that includes a first, second, third, and fourth programmable sample sequencer and that couples to the FIFO register block and the control/status register block. And, the programmable sample sequencer of the unit couples to each corresponding FIFO conversion register. And further, the unit includes a first, second, third, and fourth trigger event control multiplexer that couples to the control/status register block, where each trigger event control multiplexer corresponds to each programmable sample sequencer.

BRIEF DESCRIPTION OF DRAWINGS

To further aid in understanding the invention, the attached drawings help illustrate specific features of the invention and the following is a brief description of the attached drawings.

DISCLOSURE OF INVENTION

The present invention is a method and apparatus for a Analog To Digital Converter Unit. This disclosure describes numerous specific details in order to provide a thorough understanding of the present invention. One skilled in the art will appreciate that one may practice the present invention without these specific details. Additionally, this disclosure does not describe some well known items in detail in order not to obscure the present invention.

Figure 1:
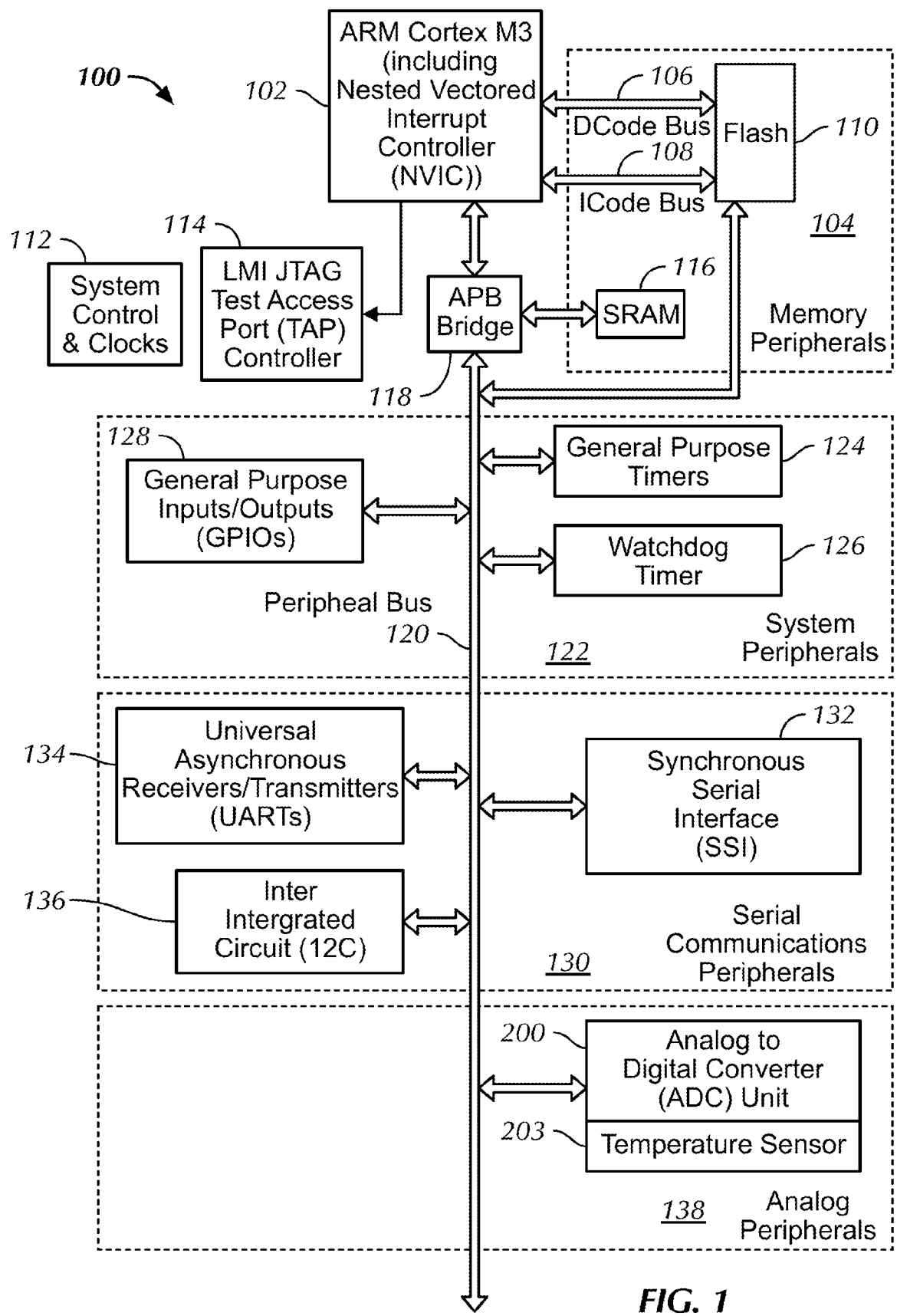
FIG. 1 illustrates an exemplary microcontroller that includes the present invention.

FIG. 1 illustrates an exemplary microcontroller that includes the present invention. The disclosed microcontroller 100 uses may be for example the LUMINARY MICRO STELLARIS LM3S828. This microcontroller 100 comprises a microcontroller core 102 that may be for example an ARM CORTEX-M3 microcontroller core. The microcontroller 100 may also include memory peripherals 104 that may include an embedded FLASH memory 104 and a SRAM 116. The microcontroller 100 may also include a D-Code bus 106 for data and an I-Code bus 108 for instructions. Additionally, microcontroller 100 may also include an ARM compatible APB bridge 118 that couples the microcontroller 102 and the memory peripherals 104 to the peripheral bus 120. Further, the microcontroller 100 may include circuitry for system control and system clocks 112. In addition, the microcontroller 100 may also include a JTAG Test Access Port (TAP) controller 114.

The system peripheral bus 120 allows a number of additional devices to be coupled to the microcontroller core 102. Thus, the microcontroller 100 may include system peripherals 122 that couple to the peripheral bus 120. The system peripherals 122 may include one or more general purpose timers 124, one or more watchdog timers 126, or one or more general purpose input/outputs 128. In addition, the microcontroller 100 may include serial communications peripherals 130 that couple to the peripheral bus 120. The serial communications peripherals 130 may include a synchronous serial interface (SSI) 132, a universal asynchronous receiver/transmitter (UART) 134, or an inter integrated circuit (I2C) 136. Further, the microcontroller 100 may include analog peripherals 138 that couple to the peripheral bus 120. The analog peripherals 138 may include an Analog to Digital Converter (ADC) Unit 200 that may further include an integrated internal temperature sensor 203.

Figure 2:
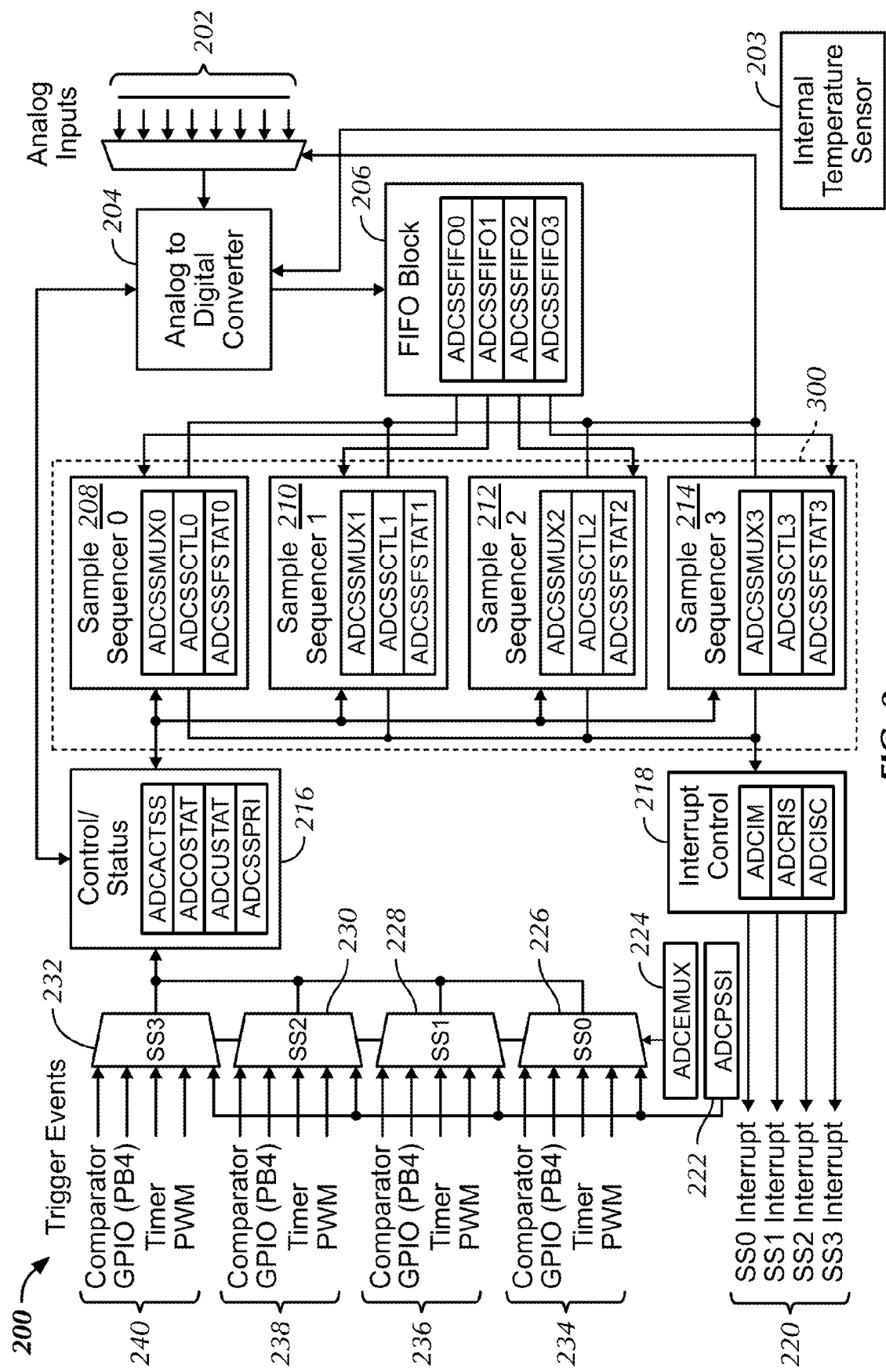
FIG. 2 illustrates a block diagram of the present invention.

FIG. 2 illustrates a block diagram of the present invention, an Analog to Digital Converter (ADC) Unit 200. The ADC Unit 200 may also include an integrated internal temperature sensor 203. Coupled to the ADC Unit 200 are one or more analog inputs 202 that allow the microcontroller 100 to sample or "read" any type of external analog signal. The Unit 200 includes an Analog to Digital Converter 204 that converts the analog signals into an equivalent digital representation of the signal. The Analog to Digital Converter 204 is a SAR design that generates a 10 bit output value for the analog input selected for the sample.

The Unit 200 additionally includes a First in First Out (FIFO) register block 206. The FIFO register block 206 further comprises a first conversion register FIFO0, a second conversion register FIFO1, a third conversion register FIFO2, and a fourth FIFO3 FIFO conversion register. The Unit 200 further includes a control/status register block 216 that controls its operation.

Another component of the Unit 200 is a programmable sequencer 300. This programmable sequencer 300 may further comprises a first programmable sample sequencer 208, a second programmable sample sequencer 210, a third programmable sample sequencer 212, and a fourth programmable sample sequencer 214. The preferred embodiment of the present invention uses 4 programmable sample sequencers. However, using the knowledge gleaned from this disclosure, one skilled in the art will appreciate that other embodiments of the present invention may use a different number of programmable sample sequencers.

The Unit 200 also includes a first trigger event control multiplexer 226, a second trigger event control multiplexer 228, a third trigger event control multiplexer 230, and a fourth 232 trigger event control multiplexer. Each trigger event control multiplexer corresponds to a programmable sample sequencer 208-214. The Unit 200 further includes a unit multiplexer 224 to control the trigger event control multiplexers 234-240. Each trigger event control multiplexer 226-232 couples to its respective trigger event inputs 234, 236, 238, and 240. The preferred embodiment of the present invention includes trigger events for a PWM, a timer, a comparator, and a GPIO/external pin input. One skilled in the art, however, will appreciate that other embodiments of the present invention may use different trigger events.

The Unit 200 further includes a processor sample sequence initiate interface 222. And, the Unit 200 includes an ADC unit interrupt controller 218 that generates interrupts 220 for the trigger event controllers 226-232.

The ADC Unit 200 of the present invention collects sample data by using a programmable sequence-based approach instead of the traditional single or double-sampling approach found on other analog to digital modules. Each sample sequence is a fully programmed series of consecutive (back to back) samples, allowing the ADC Unit 200 to collect data from multiple input sources without having to be re-configured or serviced by the microcontroller core. The programming of each sample in the sample sequence includes parameters such as the input source and mode (differential versus single-ended input), interrupt generation on sample completion, and the indicator for the last sample in the sequence. In addition, the present invention allows a user to couple a user specified event to a particular programmable sample sequencer. And further, the present invention allows the user specified events to include using multiple programmable sample sequencers together.

Once a user specified event has been processed, the control/status register block 216 starts the proper programmable sample sequencer 300. The individual programmable sample sequencers 208-214 are programmed with the exact sequence and parameters for each sample to be taken. Each individual programmable sample sequencer 208-214 communicates through its Sample Control for Analog Converter (SCTL0-SCTL3) to provide control information back to the control/status register block 216 and also to control the capturing of data from the analog to digital converter 204. The interface between these parts of the Unit 200 may be pipelined in order to hide the clock crossing that must occur from the processor domain to the analog domain.

Handshake signals for the Start of Conversion (SOC) and End of Conversion (EOC) are fed back from the SCTL to coordinate the timing from sample to sample and sequence to sequence. This allows for back-to-back and repeat style sequences without jitter in the sample time and full rate sampling of the converter. In addition, interrupts are user programmable and can occur during any sample in the sequence. It is the responsibility of the user software to properly maintain the FIFO conversion registers so that there is not an "overflow" or "underflow" condition that occurs. Hardware does provide a status for these events to facilitate debug and error handling.

The Event Multiplexer Select (EMUX) 224 controls event conditioning and prioritization in Unit 200. The multiplexer 224 is where the user connects the user specified event to a specific programmable sample sequencer. The user programmable events are conditioned to detect a positive edge by sampling with the system microcontroller clock. When events happen concurrently, they are prioritized for processing through the control/status register block 216. Even though one event may occur before a second event, the second event still may be processed sooner because the prioritizing occurs at the clock when the control/status register block 216 looks for the next event to process. The control/status register block does not queue events until it determines the previous event is on its ending sample.

The control/status register block 216 allows the microcontroller 100 to control the actions of the Unit 200 through a number internal registers. In addition, this block deals with all of the high level information like interrupts, enabled sequencers, overflows and underflows. It also manages the starting, ending and transitions from one programmable sequencer to another. The user may set the programmable sample sequencers priority through the Sample Sequencer Priority (SSPRI) register. The user can initiate events to any or all of the programmable sample sequencers through the Processor Sample Sequence Initiate (PSSI) register. Further, the user can control the current programmable sample sequencer through the Active Sample Sequencer (ACTSS) register. Overflow status of the programmable sample sequencers is controlled via the Overflow Status (OSTAT) register. And, the underflow status of the programmable sample sequencers is controlled via the Underflow Status (USTAT) register.

The detailed control and data capture is done by the programmable sequencer 300 that in one embodiment of the present invention further comprises a first programmable sample sequencer 208, a second programmable sample sequencer 210, a third programmable sample sequencer 212, and a fourth programmable sample sequencer 214. The programmable sample sequencers are identical in implementation except for the number of samples that can be provided by the sample sequence and the depth of the corresponding FIFO conversion register. In the preferred embodiment of the present invention, the first programmable sample sequencer 208 includes 8 samples with an 8 entry, 10 bit wide FIFO conversion register FIFO0. The second programmable sample sequencer 210 includes 4 samples with a 4 entry, 10 bit wide FIFO conversion register FIFO1. The third programmable sample sequencer 212 includes 4 samples with a 4 entry, 10 bit wide FIFO conversion register FIFO2. And, the fourth programmable sample sequencer 214 includes 1 sample with a 1 entry, 10 bit wide FIFO conversion register FIFO3. In the preferred embodiment of the present invention, the FIFO Block 206 width is 10 bits and it is mapped to the lower 10 bits of a 32 bit word.

A sample definition within an individual programmable sample sequencer is comprised of 2-4 bit values contained in the SSMUXx and the SSCTLx register where "x" is 3.0 representing the sequencer number. The SSMUXx nibble [4*(i+1)-1:4*i] contains the analog input pin select. The number of analog inputs is part dependent over the LUMINARY MICRO STELLARIS product line. Multiple uses of the same input pin within a sequence are allowed.

The SSCTLx nibble [4*(i+1)-1:4*i] contains the sample control bits to the corresponding SSMUXx nibble. In addition to the SSMUX and SSCTL registers within each programmable sample sequencer, there is also a read only FIFO status register (FSTAT). This register may be useful in debug of software and provides detailed FIFO block status.

The control/status register block 216 also manages the control signals to the converter 204. In the preferred embodiment of the present invention, most of this block runs at the ADC Clock rate of 14 MHz to 18 MHz as defined by the ADC Clock Divider in the system and control block 112. This divider is part specific and created to adhere to the stated frequency requirement above. A Start Of Conversion (SOC) signal along with the appropriate mux and control information (i.e. differential) are passed to the analog to digital converter 204 to start a sample conversion. The converter 204 provides back an End Of Conversion signal to indicate that the data bits are valid to be stored in a particular FIFO conversion register. These control signals are passed across the microcontroller clock domain to provide information on when to change the sample information, generate interrupts, and/or move to the next sequencer.

The ADC Unit 200 of the present invention provides the user of the microcontroller 100 the ability to program a sequence to the conversion process. By sequence, we mean the set of ordered ADC inputs. By program, we mean the number of conversions performed and the order in which they're performed. For example, one can get the same input to provide 1-8 successive samples of the same pin (maximum rate sample) by setting the sample sequence to be {ch0, ch0, ch0, ch0, ch0, ch0, ch0, ch0}. Or, one can get the same two inputs to alternate 1-4 successive samples by setting the sample sequence to be {ch0, ch1, ch0, ch1, ch0, ch1, ch0, ch1}. Or, one can get all inputs sampled by setting the sample sequence to be {ch0, ch1, ch2, . . . , ch7}. The preferred embodiment of the present invention implements 4 sequences, where the maximal lengths of each sequence being {8, 4, 4, 1}. The user can prioritize each sample sequence. Thus, the present invention can have 4 different sequences programmed into it.

Additionally, the ADC Unit 200 of the present invention provides for event-initiated sampling. In other words, like interrupts, system events may initiate a sample sequence to activate for analog to digital conversion. The benefit to this feature is that an event may start the present invention sampling a sequence of pins without the need for intervention by the microcontroller core unit 102. For example, the user can program the sequence events to {comparator, timer, -, processor}, in the priority order {0, 1, 2, 3}. This prioritizes the sample as follows: (highest priority) Comparator event (e.g. input voltage exceeds reference) initiates a sample sequence up to 8 conversions long (possibly digitizing back EMF on a motor when it exceeds a threshold value), (second highest priority) Timer event (e.g. regular periodic sample) initiates a sample sequence of up to 4 conversions long, (third highest priority) not specified, and finally (fourth highest or lowest priority) Processor event (i.e. as part of program execution) samples one channel once.

To summarize, the present invention discloses a programmable Analog to Digital Converter (ADC) unit that includes the following components. An analog to digital converter that couples to one or more analog inputs. Additionally, a control/status register block that controls the operation of the unit and couples to the analog to digital converter. A FIFO register block with a first, second, third, and fourth FIFO conversion register that couples to the analog to digital converter. Further, a programmable sequencer that includes a first, second, third, and fourth programmable sample sequencer and that couples to the FIFO register block and the control/status register block. And, the programmable sample sequencer of the unit couples to each corresponding FIFO conversion register. And further, the unit includes a first, second, third, and fourth trigger event control multiplexer that couples to the control/status register block, where each trigger event control multiplexer corresponds to each programmable sample sequencer.

Other embodiments of the present invention will be apparent to those skilled in the art after considering this disclosure or practicing the disclosed invention. The specification and examples above are exemplary only, with the true scope of the present invention being determined by the following claims.

We claim:

1. An programmable Analog to Digital Converter (ADC) unit, comprising:
    an analog to digital converter coupled to one or more analog inputs;
    a control/status register block that controls the operation of the unit and couples to said analog to digital converter;
    a FIFO register block that further comprises a first, second, third, and fourth FIFO conversion register, said FIFO register block couples to said analog to digital converter;
    a programmable sequencer that further comprises a first, second, third, and fourth programmable sample sequencer, said programmable sequencer couples to said FIFO register block and said control/status register block; and
    wherein each said programmable sample sequencer couples to each corresponding said FIFO conversion register.

2. A method to make a programmable Analog to Digital Converter (ADC) unit, comprising:
    coupling an analog to digital converter to one or more analog inputs;
    coupling a control/status register block that controls the operation of the unit to said analog to digital converter;
    coupling a FIFO register block to said analog to digital converter, said FIFO register block further comprises a first, second, third, and fourth FIFO conversion register;
    coupling a programmable sequencer to said FIFO register block and said control/status register block, said programmable sequencer further comprises a first, second, third, and fourth programmable sample sequencers; and
    coupling each said programmable sample sequencer to each corresponding said FIFO conversion register.

3. A method to use a programmable Analog to Digital Converter (ADC) unit, comprising:
    programming a programmable sequencer that further comprises a first, second, third, and fourth programmable sample sequencer, said programmable sequencer couples to a FIFO register block and a control/status register block;
    receiving input through one or more analog inputs to an analog to digital converter;
    using a control/status register block that controls the operation of the unit and couples to said analog to digital converter;
    wherein said FIFO register block further comprises a first, second, third, and fourth FIFO conversion register, said FIFO register block couples to said analog to digital converter; and
    wherein each said programmable sample sequencer couples to each corresponding said FIFO conversion register.

4. The claim of claim 1, 2, or 3 further comprising a first, second, third, and fourth trigger event control multiplexer that couples to said control/status register block, wherein each trigger event control multiplexer corresponds to each said programmable sample sequencer.

5. An programmable Analog to Digital Converter (ADC) unit, comprising:
    an analog to digital converter coupled to one or more analog inputs;
    a control/status register block that controls the operation of the unit and couples to said analog to digital converter;

a FIFO register block that further comprises a first, second, third, and fourth FIFO conversion register, said FIFO register block couples to said analog to digital converter;

a programmable sequencer that further comprises a first, second, third, and fourth programmable sample sequencer, said programmable sequencer couples to said FIFO register block and said control/status register block;

a first, second, third, and fourth trigger event control multiplexer that couples to said control/status register block, wherein each trigger event control multiplexer corresponds to each said programmable sample sequencer; and wherein each said programmable sample sequencer couples to each corresponding said FIFO conversion register.

6. A method to make a programmable Analog to Digital Converter (ADC) unit, comprising:

coupling an analog to digital converter to one or more analog inputs;

coupling a control/status register block that controls the operation of the unit to said analog to digital converter;

coupling a FIFO register block to said analog to digital converter, said FIFO register block further comprises a first, second, third, and fourth FIFO conversion register;

coupling a programmable sequencer to said FIFO register block and said control/status register block, said programmable sequencer further comprises a first, second, third, and fourth programmable sample sequencers;

coupling a first, second, third, and fourth trigger event control multiplexer that couples to said control/status register block, wherein each trigger event control multiplexer corresponds to each said programmable sample sequencer; and coupling each said programmable sample sequencer to each corresponding said FIFO conversion register.

7. A method to use a programmable Analog to Digital Converter (ADC) unit, comprising:

programming a programmable sequencer that further comprises a first, second, third, and fourth programmable sample sequencer, said programmable sequencer couples to a FIFO register block and a control/status register block;

receiving input through one or more analog inputs to an analog to digital converter;

using a control/status register block that controls the operation of the unit and couples to said analog to digital converter;

using a first, second, third, and fourth trigger event control multiplexer to send trigger events to said control/status register block, each said trigger event control multiplexer couples to said control/status block, and wherein each said trigger event control multiplexer corresponds to each said programmable sample sequencer;

wherein said FIFO register block further comprises a first, second, third, and fourth FIFO conversion register, said FIFO register block couples to said analog to digital converter; and wherein each said programmable sample sequencer couples to each corresponding said FIFO conversion register.

* * * * *